United States Patent [19]

Bini et al.

[11] 4,423,372

[45] Dec. 27, 1983

[54] INSTRUMENT FOR MONITORING THE RADIATION HAZARD ARISING FROM ELECTRIC AND/OR MAGNETIC RADIO-FREQUENCY FIELDS

[75] Inventors: Marco Bini, Pistoia; Amleto Ignesti, Florence; Luigi Millanta, Florence; Nicola Rubino, Florence; Riccardo Vanni, Florence, all of Italy

[73] Assignee: Consiglio Nazionale Delle Ricerche, Rome, Italy

[21] Appl. No.: 250,212

[22] Filed: Apr. 2, 1981

[30] Foreign Application Priority Data

Apr. 3, 1980 [IT] Italy ............................... 9397 A/80

[51] Int. Cl.³ ........................................... G01R 31/02
[52] U.S. Cl. ...................................... 324/72; 324/133
[58] Field of Search .................. 324/72, 133; 340/753, 340/754

[56] References Cited

U.S. PATENT DOCUMENTS 4,005,365 1/1977 Berger et al. ...................... 324/133
4,277,744 7/1981 Audone et al. ....................... 324/72

Primary Examiner—Michael J. Tokar
Assistant Examiner—Kevin D. O'Shea
Attorney, Agent, or Firm—D. Paul Weaver

[57] ABSTRACT

An instrument for monitoring the hazard arising from electro-magnetic (electric and/or magnetic) radio-frequency fields comprising an electric and/or magnetic field probe, a radio-frequency converter for converting the signals picked up by the probe into continuous current electric signals, a comparator for comparing the continuous current electric signals with predetermined reference values, and output indicators activated by the output signals of the comparator. Preferably the reference values divide the values of the field levels into three contiguous zones, respectively-of insignificant risk, of possible risk and of certain risk.

8 Claims, 4 Drawing Figures

INSTRUMENT FOR MONITORING THE RADIATION HAZARD ARISING FROM ELECTRIC AND/OR MAGNETIC RADIO-FREQUENCY FIELDS

THE INVENTION

The present invention relates to an instrument for monitoring the radiation hazard arising from electric and/or magnetic radio-frequency fields.

BACKGROUND OF THE INVENTION

The use of radio-frequency heating equipment has become quite common in industry in recent years. At the same time it is suspected that the electric and magnetic fields produced by such equipment are dangerous to people, and in particular to workers. Thus, safety regulations have been issued in a number of countries, regarding the operation of such equipment, with respect to the permissible levels of exposure. These safety regulations are not generally accepted however. Therefore, manufacturers and users of industrial radio-frequency heating equipment are not bound to comply with them to warrant low levels of field emission, either at the manufacturing stage, or in connection with maintainance procedures. On the other hand, both social and health bodies and scientific institutions are more and more frequently requested to ascertain possible dangerous conditions in the above mentioned field.

A careful survey of the conditions under which equipment is likely to create electric or magnetic fields has given following results:

The intensity of electric or magnetic fields decreases rapidly with the distance from the source; thus areas of possible risk for the workers are confined to the space immediately surrounding the source and possibly the metal structures electrically coupled to them;

Generally, only electric fileds are observed close to the machines, whereas the occurrence of significant magnetic fields is less frequent;

The intensity and frequency of the fields vary both in a short span of time (due to instability and to loading conditions) and over long intervals (due to aging of the equipment and due to intentional or unintentional modifications).

As a consequence, the control of the electric field intensity (and less frequently that of the magnetic field) carried out from time to time by highly skilled operators, with high precision equipment on one hand, cannot be easily carried out on a large scale and on the other hand the number of skilled operators available is not sufficient to give a final answer to the above mentioned concern.

OBJECTIVES OF THE INVENTION

A practical solution to the above problem and primary objective of the invention is to arrange conveniently located means for frequent and quick control of the fields with simple procedures to be carried out by non-skilled operators, leaving to the highly trained personnel the task of testing more complex situations.

Taking into account the above mentioned observations and requirements, another aim of the present invention is to create a practical instrument, of low cost and easy use, to indicate possible risk conditions with reference to given safety standards.

A further objective of the invention is to manufacture an instrument which makes it possible to perform an easy, quick and frequent test of possible risk conditions, and fulfil the following requirements:

It can be easily used, even by operators completely unaware of the problems connected with the measurement of electric and magnetic fields;

It is a portable, rugged instrument relatively unaffected by variations of environmental conditions (temperature, humidity, dusts, etc.);

It is a simple and low cost tool, and therefore likely to receive quite a large diffusion. A large diffusion, and hence immediate availability is essential to the satisfaction of the above outlined operating needs.

The foregoing and other objectives of the invention will become apparent in light of the drawings, specification and claims contained herein.

SUMMARY OF THE INVENTION

According to the invention the scope is attained with an instrument for monitoring the hazard arising from electric or magnetic radio-frequency fields, wherein there is provided a probe to sense the electric and/or magnetic field, a converter for converting the radio-frequency signals picked up by the probe into continuous current electric signals, a comparator for comparing the electric signal with predetermined reference values, and output indicators activated by the output signals of the comparator.

Still according to the invention, the instrument may comprise a plurality of output indicators which may be activated by the signals resulting from the comparison of the signals detected by the probe to the reference standards, wherein when one of the indicators is activated all the other are not.

The present invention is further explained here below, in a preferred embodiment, referred by mere way of non-limitative example, with reference to the attached designs, where:

DESCRIPTION OF THE INVENTION

As it can be seen from the figures, the instrument according to the invention comprises a balanced isotropic probe 1 having the shape of a sphere 2 and made of expanded polyurethane, inside of which three electric field transducers 5 are provided, made on epoxy-glass printed-circuit board, oriented at 90° to each other.

Figure 2:
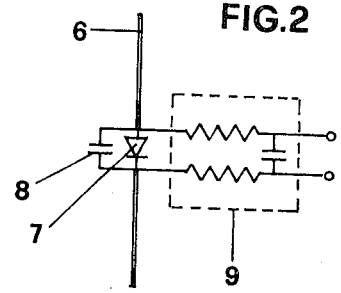
FIG. 2 is a schematic view of an electric field detector which is a part of the instrument according to the invention.

Note in FIG. 2 that each transducer 5 consists of a short dipole 6, a converter, in the present embodiment a germanium diode detector 7, an equalizing condenser 8 and a decoupling RC filter 9 for the radio-frequency.

The germanium diode 7 offers the double advantage of a low price and a low impedance. A low impedance favors a low susceptibility of the instrument to unwanted couplings.

Figure 1:
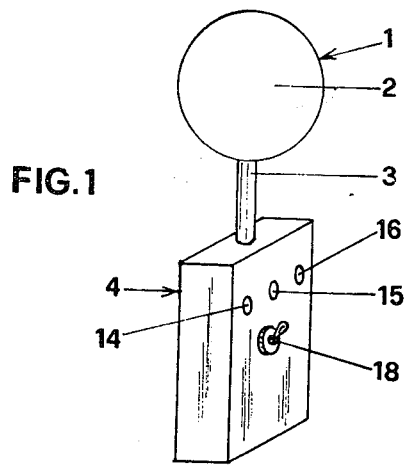
FIG. 1 is a perspective schematic view of the instrument according to the invention.
Figure 3:
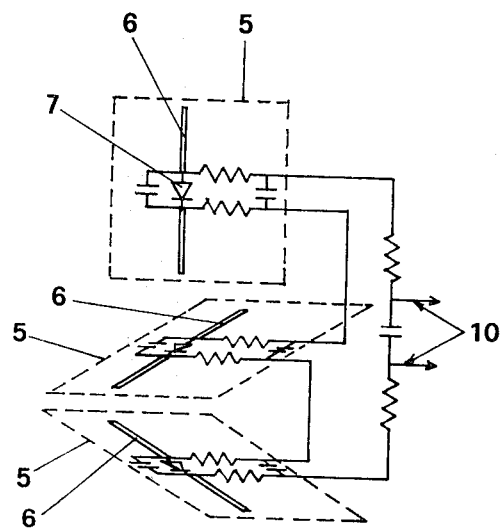
FIG. 3 is a schematic perspective view of the three detectors used in the preferred embodiment.

The three transducers 5 illustrated in FIG. 3 are connected in series and the series is in turn connected to an electronic circuit, contained inside the body 4 of the instrument, illustrated in FIG. 1, by means of a braided two-wire cable 10 running inside a PVC tubing 3, connecting the probe to the body 4.

Figure 4:
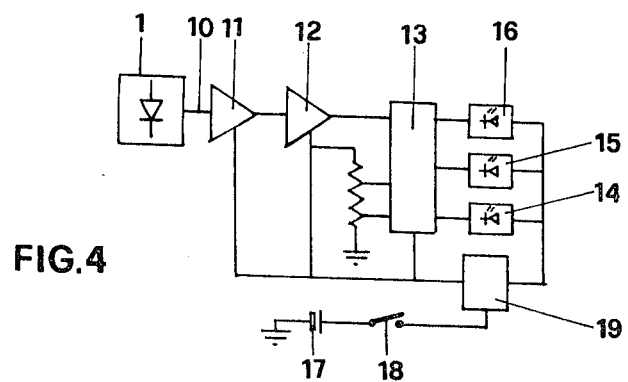
FIG. 4 is a block diagram of the instrument according to the invention.

In FIG. 4, the series circuit of the three transducers 5 is connected to a high input impedance and unity gain amplifier 11, the output of which is connected to a second amplifier 12. The latter is connected to a multiple comparator 13, in which (in the described embodiment) it is possible to set two predetermined threshold values denoted herein as $V_A$ and $V_B$ (where $V_A < V_B$). The comparator 13 is provided with three outputs, or, in the general case, with n+1 outputs, if n is the number of the predetermined threshold values, which feed a corresponding number of outputs 14, 15, 16, preferably consisting of light-emitting diodes (LED), having respectively green, yellow and red colour lenses.

The instrument is powered by battery 17, through a switch 18 and a circuit 19, which controls the state of charge of the battery.

The instrument according to the invention operates as follows:

First of all, during the adjustment stage, the values $V_A$ and $V_B$ are determined.

These values correspond to electric or magnetic field intensities and define dividing points for the values of the field levels detected to create three areas: the lower one which can be defined "of insignificant risk", the intermediate one, which may be defined "of possible risk", and the higher one which may be defined "of certain risk". The permanence of operators in the area of insignificant risk may extend for an almost unlimited time; the higher limit of the value of the field, $V_A$, may be set on the basis of the most restrictive safety standards existing in the world (at present those issued in the USSR, which takes into account even possible subthermal effects): Nobody, in fact, considers that there is any risk, below these limits.

The "certain risk" area is characterized by values of the electric or magnetic field which present risk conditions: the permanence of operators in such an area, even for a short time is therefore to be avoided. The lower limit of such field values, $V_B$, may be set on the basis of the less restrictive standands of the world, (at present those corresponding to some U.S.A. or military recommendations, which refer to thermal risk).

The area of possible risk refers obviously to conditions intermediate between those of the above mentioned areas: thus the permanence in such area is allowed, but only for limited time, or under otherwise controlled conditions.

After adjustment, the instrument is ready for operation. It is placed in the area to be tested and is switched on by switch 18. The three mutually orthogonal transducers 5 of the probe 1, are connected in series, in such a way that the continuous current signal, coming from each of them, is added to the signals originated by the other two. Each transducer 5 is designed to operate in the square-law region, at least up to the lighting threshold of the LED's 14, 15 and 16. Therefore, at the two ends of the two wire cable 10, a voltage is present which is proportional to the sum of the squares of the components of the electric field detected by each transducer. This superimposes, in root-mean-square value, electrical fields having various frequencies or, in particular, the harmonics generated by the radio-frequency machine, falling within the band of the monitoring instrument according to the invention. Thus the operator is not involved in the spectral content of the radio-frequency electric fields, and the instruments' use is within reach of untrained personnel.

The signal detected by the probe 1 is sent through the two wire cable 10 to the amplifier 11, which separates the electronic circuit from the probe. The signal is then amplified in 12, and sent as signal $V_R$ to the comparator 13, where it is compared with the two threshold values $V_A$ and $V_B$. If $V_R < V_A$ the comparator 13 switches the green LED 14 on; if $V_A \leq V_R \leq V_B$, the comparator 13 switches the yellow LED 15 on, and turns the LED 14 off, if $V_R > V_B$ the comparator 13 switches the red LED 16 on and turns off the green LED 14 and the yellow LED 15.

The circuit 19 checks the state of charge of the batteries, whenever the switch 18 is switched on. In fact in such condition, if any of the LED's 14, 15 or 16 are on, the batteries are charged, whereas if none of the LED's are lighted, the batteries are discharged.

From the above it clearly appears that the instrument according to the present invention offers a number of advantages and in particular:

- it provides a convenient monitoring of the various risk conditions, on the basis of predetermined standards;
- it is easy to use, even by operators completely unaware of the problems connected with the measurement of electric and magnetic fields;
- it is portable, rugged and fairly insensitive to the variation of environmental conditions (temperature, humidity, dusts, etc.);
- it operates in a simple way, its manufacture is inexpensive and therefore it may be widely diffused.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What I claim is:

1. An instrument for signalling the presence of an electric and/or magnetic radiofrequency field in excess of preset levels, comprising:
    a field probe responsive to an electric and/or magnetic field;
    said field probe including a plurality of field sensors electrically interconnected to provide an output of said field probe, the magnitude of which is a function of the magnitude of the sensed field;
    a comparator means for comparing said output of said field probe with preset reference values comprising first and second values and providing a plurality of output signals as a function of said comparisons; and
    a plurality of output indicators activated mutually exclusively by said output signals from said comparator to provide an indication indicative of the field sensed by said field probe being below a first value, between said first and a second value, or above said second value.

2. An instrument as defined in claim 1 wherein said field sensors are mutually orthogonal and each of said field sensors comprises a balanced dipole antenna, a diode detector, an equalizing capacitor and a decoupling resistive/capacitive filter for radiofrequency signals.

3. An instrument as defined in claim 1, wherein each of said field sensors is so designed that, within the useful range of said instrument, its output signal is proportional to the square of the amplitude of the field incident on it; and the outputs of each of said field sensors are connected in series to provide a total output voltage proportional to the square of the modulus of the total incident field.

4. An instrument as defined in claim 2, wherein each of said field sensors is so designed that, within the useful range of said instrument, its output signal is proportional to the square of the amplitude of the field incident on it; and the outputs of each of said three sensors are connected in series to provide a total output voltage proportional to the square of the modulus of the total incident field.

5. An instrument as defined in claim 1 wherein said output of said field probe is a d.c. voltage and said preset reference values are preset voltage levels.

6. An instrument as defined in claim 1, wherein said first and second reference values correspond to values of electric and magnetic field intensity which divide the values of a field sensed by said field probe into contiguous zones.

7. An instrument as defined in claim 1, wherein said preset reference values comprise first and second reference voltages corresponding to values of electric and/or magnetic field intensity which divide the values of the electric and/or magnetic field sensed by said field probe into three zones identifying radiation levels of insignificant risk, possible risk, and certain risk, as defined by safety standards.

8. An instrument as defined in claim 1, wherein said indicators are light emitting diodes.

* * * * *